(12) United States Patent
Wang et al.

(10) Patent No.: US 12,431,364 B2
(45) Date of Patent: Sep. 30, 2025

(54) METHOD FOR MANUFACTURING PACKAGING ENCLOSURE AND METHOD FOR MANUFACTURING PACKAGING CHIP

(71) Applicant: Hubei Yangtze Pilot-Line Services Co., Ltd., Hubei (CN)

(72) Inventors: Yiqun Wang, Wuhan (CN); Song Wang, Wuhan (CN); Yuan Sun, Wuhan (CN); Tianjian Liu, Wuhan (CN)

(73) Assignee: Hubei Yangtze Pilot-Line Services Co., Ltd., Hubei (CN)

( * ) Notice: Subject to any disclaimer, the term of this patent is extended or adjusted under 35 U.S.C. 154(b) by 0 days.

(21) Appl. No.: 18/246,281

(22) PCT Filed: Jun. 30, 2022

(86) PCT No.: PCT/CN2022/102669
§ 371 (c)(1),
(2) Date: Mar. 22, 2023

(87) PCT Pub. No.: WO2023/178874
PCT Pub. Date: Sep. 28, 2023

(65) Prior Publication Data
US 2024/0312794 A1    Sep. 19, 2024

(30) Foreign Application Priority Data
Mar. 22, 2022 (CN) .......................... 202210283093.8

(51) Int. Cl.
*H01L 21/48* (2006.01)
*H01L 21/52* (2006.01)
*H01L 23/04* (2006.01)

(52) U.S. Cl.
CPC ............ *H01L 21/481* (2013.01); *H01L 21/52* (2013.01); *H01L 23/04* (2013.01)

(58) Field of Classification Search
None
See application file for complete search history.

(56) References Cited

U.S. PATENT DOCUMENTS

| 8,168,474 B1 | 5/2012 | Adkisson |
| 9,018,094 B2 | 4/2015 | Kosenko |

(Continued)

FOREIGN PATENT DOCUMENTS

| CN | 110467148 A | 11/2019 |
| CN | 111952196 A | 11/2020 |

(Continued)

OTHER PUBLICATIONS

International Search Report in the international application No. PCT/CN2022/102669, mailed on Oct. 24, 2022. 6 pages with English translation.

*Primary Examiner* — Jack S Chen
(74) *Attorney, Agent, or Firm* — Syncoda LLC; Feng Ma

(57) ABSTRACT

A method for manufacturing a packaging enclosure includes the following operations. A substrate which has a first surface and a second surface opposite to each other, is provided. A hole of which the bottom is located in the substrate, is formed in the first surface of the substrate. The first surface of the substrate with the formed hole is bonded onto a carrier which covers the hole. A groove which is communicated with the hole in a direction perpendicular to the substrate, is formed in the second surface of the substrate after bonding the first surface onto the carrier. The second surface of the substrate with the formed groove is fixed to a bearing layer. The carrier is removed after fixing the second surface to the bearing layer. The bearing layer is removed after removing the carrier.

13 Claims, 8 Drawing Sheets

(56) References Cited

U.S. PATENT DOCUMENTS

| 9,718,674 | B2 | 8/2017 | Kalvesten |
| 2012/0228778 | A1 | 9/2012 | Kosenko |
| 2012/0267773 | A1 | 10/2012 | Ebefors |
| 2014/0252655 | A1 | 9/2014 | Tran et al. |
| 2016/0207758 | A1 | 7/2016 | Kalvesten et al. |
| 2024/0312794 | A1* | 9/2024 | Wang ..................... H01L 21/52 |

FOREIGN PATENT DOCUMENTS

| CN | 112117195 A | 12/2020 |
| CN | 113299561 A | 8/2021 |
| CN | 114388366 A | 4/2022 |
| JP | 2005064024 A | 3/2005 |
| JP | 2010199429 A | 9/2010 |
| JP | 2011205391 A | 10/2011 |
| JP | 2013535834 A | 9/2013 |
| JP | 2022006852 A | 1/2022 |
| KR | 20140124251 A | 10/2014 |
| WO | 2011118787 A1 | 9/2011 |

\* cited by examiner

METHOD FOR MANUFACTURING PACKAGING ENCLOSURE AND METHOD FOR MANUFACTURING PACKAGING CHIP

CROSS-REFERENCE TO RELATED APPLICATIONS

This application is a National Stage of International Application No. PCT/CN2022/102669 filed on Jun. 30, 2022, which claims priority to Chinese Patent Application No. 202210283093.8 filed on Mar. 22, 2022. The disclosures of the above-referenced applications are hereby incorporated by reference in their entirety.

TECHNICAL FIELD

Embodiments of the disclosure relate to the technical field of semiconductor packaging, and in particular, to a method for manufacturing a packaging enclosure and a method for manufacturing a packaging chip.

BACKGROUND

Packaging processes of a semiconductor chip refers to process steps of encapsulating and fixing one or more semiconductor chips cut from a wafer into a packaging enclosure which is intended to prevent physical damage, corrosion, or the like, so as to carry and support the semiconductor chips, avoid the semiconductor chips from directly contacting with an external environment, and prevent damage and failure of the semiconductor chips.

In an integrated circuit (IC), a variety of semiconductor chips and other electronic components may be integrated together, to form an electronic system. With the increasing requirements for diversified and complex functions of the electronic system, volume, power consumption and weight of the electronic system are required to be further reduced, which promotes rapid development of electronic integration technologies. Different semiconductor chips have different functions, and process nodes, wafer sizes and sizes of semiconductor chips vary greatly. How to implement packaging and integration of these semiconductor chips with different sizes, different materials, different processes and different functions, and how to improve a yield rate of a process of manufacturing the packaging enclosure, have become an urgent problem to be solved.

SUMMARY

In view of this, the embodiments of the disclosure provide a method for manufacturing a packaging enclosure and a method for manufacturing a packaging chip.

According to a first aspect of the embodiments of the disclosure, there is provided a method for manufacturing a packaging enclosure, including the following operations.

A substrate which has a first surface and a second surface opposite to each other, is provided.

A hole is formed in the first surface of the substrate, bottom of the hole is located in the substrate.

The first surface of the substrate with the formed hole is bonded onto a carrier which covers the hole.

A groove is formed in the second surface of the substrate after bonding the first surface onto the carrier, the groove is communicated with the hole in a direction perpendicular to the substrate.

The second surface of the substrate with the formed groove is fixed to a bearing layer.

The carrier is removed after the second surface is fixed to the bearing layer.

The bearing layer is removed after the carrier is removed.

In some embodiments, before forming the hole, the method may further include the following operations.

A dielectric layer is formed, the dielectric layer covers the first surface and an electrical connection structure is embedded in the dielectric layer.

The hole includes a first sub-hole and a second sub-hole communicated with each other, and the operation of forming the hole in the first surface of the substrate includes the following operations.

A first etching is performed on the dielectric layer at a preset forming position of the hole, until the substrate is exposed, to form the first sub-hole.

A second etching is performed on the bottom of the first sub-hole, to penetrate a part of thickness of the substrate, to form the second sub-hole of which the bottom is located in the substrate.

In some embodiments, before forming the second sub-hole, the method may further include the following operations.

A barrier layer is formed, the barrier layer covers an inner wall of the first sub-hole.

The operation of performing the second etching includes the following operations.

The second etching is performed on the substrate and the barrier layer at the bottom of the first sub-hole, to penetrate the part of thickness of the substrate and the barrier layer at the bottom of the first sub-hole, to form the second sub-hole.

In some embodiments, the operation of bonding the first surface of the substrate with the formed hole onto the carrier may include the following operations.

An adhesion layer is formed in a surface of at least the dielectric layer or the carrier after forming the hole, and the dielectric layer is bonded onto the carrier by the adhesion layer.

In some embodiments, before forming the adhesion layer, the method may further include the following operations.

A filler which at least closes an opening of the hole, is formed in the hole.

In some embodiments, a composition material of the filler may be the same as that of the adhesion layer.

In some embodiments, after removing the carrier, the method may further include the following operations.

The adhesion layer and the filler in the hole are removed.

In some embodiments, the operation of fixing the second surface of the substrate with the formed groove to the bearing layer may include the following operations. The second surface of the substrate with the formed groove is affixed to the bearing layer, to fix the second surface to the bearing layer.

After removing the carrier may include the following operations, the operation of removing the bearing layer. The bearing layer is removed after removing the adhesion layer and the filler in the hole.

In some embodiments, before forming the groove, the method may further include the following operations.

The second surface of the substrate is thinned. Here, thickness of the thinned substrate is greater than depth of the hole.

According to a second aspect of the embodiments of the disclosure, there is provided a method for manufacturing a packaging chip, including the following operations A packaging enclosure manufactured by the method is provided.

A semiconductor chip is provided.

The semiconductor chip is fixed to the packaging enclosure, and the semiconductor chip is arranged in the groove. Here, the hole exposes at least a part of area of the semiconductor chip.

In some embodiments, a surface of the semiconductor chip may be provided with a pad which is exposed from the hole, and the method may further include the following operations.

The hole is filled with a conductive material, to form a conductive plug coupled to the pad.

DETAILED DESCRIPTION

Technical solutions of the disclosure are further set forth below in combination with the drawings and specific embodiments.

In the embodiments of the disclosure, terms "first", "second", or the like are intended to distinguish similar objects, rather than describing a specific order or sequence.

In the embodiments of the disclosure, term "A is contacted with B" includes a case where A is directly contacted with B, or a case where A is indirectly contacted with B due to other components inserted between A and B.

In the embodiments of the disclosure, term "layer" refers to a material portion including an area with a thickness. The layer may extend above the entirety of a lower or upper structure, or may have a range smaller than a range of the lower or upper structure. Furthermore, the layer may be a homogeneous or heterogeneous continuous structure area of which thickness is less than thickness of a continuous structure. For example, the layer may be located between top and bottom surfaces of the continuous structure, or may be located between any pair of horizontal planes at the top and bottom surfaces of the continuous structure. The layer may extend horizontally, vertically, and/or along an oblique surface. Furthermore, the layer may include multiple sub-layers.

It may be understood that meanings of "on", "over" and "above" in the disclosure should be interpreted in the broadest way, so that "on" not only represents a meaning of "on" something without intervening features or layers (that is, directly on something), but also includes a meaning of "on" something with intervening features or layers.

It should be noted that although the description is described according to the embodiments, each embodiment does not only contain an independent technical solution. Such narration of the description is only for the purpose of clarity. Those skilled in the art should take the description as a whole. The technical solutions in the embodiments may also be combined properly, to form other embodiments which may be understood by those skilled in the art.

FIG. 1A to FIG. 1D show schematic views of a method for manufacturing a packaging enclosure according to an exemplary embodiment. With reference to FIG. 1A to FIG. 1D, the method includes the following first to fourth operations.

Figure 1A:
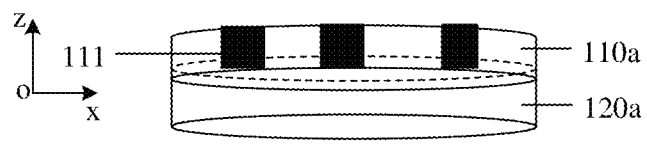
FIG. 1A shows a first schematic view of a method for manufacturing a packaging enclosure according to an exemplary embodiment.

In a first operation, with reference to FIG. 1A, a first substrate 110a which has a first surface and a second surface opposite to each other, is provided; the second surface of the first substrate 110a is bonded to a first carrier 120a; a groove 111 penetrating the first substrate 110a is formed in the first surface of the first substrate 110a, until the first carrier 120a is exposed.

Figure 1B:
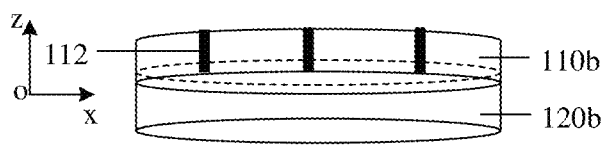
FIG. 1B shows a second schematic view of a method for manufacturing a packaging enclosure according to an exemplary embodiment.

In a second operation, with reference to FIG. 1B, a second substrate 110b which has a third surface and a fourth surface opposite to each other, is provided; the fourth surface of the second substrate 110b is bonded to a second carrier 120b; a hole 112 penetrating the second substrate 110b is formed in the third surface of the second substrate 110b, until the second carrier 120b is exposed, here diameter of the hole 112 is less than that of the groove 111.

Figure 1C:
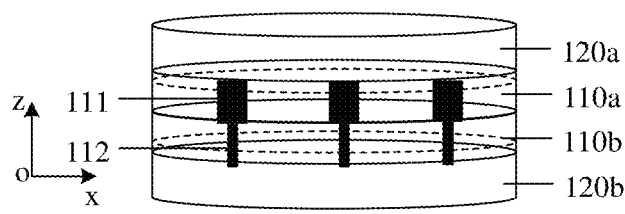
FIG. 1C shows a third schematic view of a method for manufacturing a packaging enclosure according to an exemplary embodiment.

In a third operation, with reference to FIG. 1C, the first surface of the first substrate 110a is bonded to the third surface of the second substrate 110b, here the groove 111 is communicated with the hole 112 in a direction perpendicular to the first substrate 110a and the second substrate 110b.

Figure 1D:
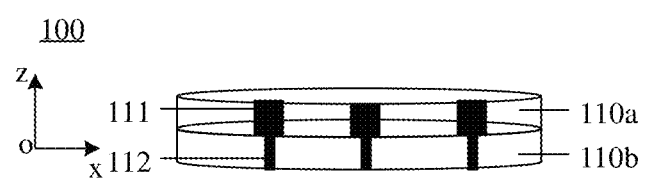
FIG. 1D shows a fourth schematic view of a method for manufacturing a packaging enclosure according to an exemplary embodiment.

In a fourth operation, with reference to FIG. 1D, the first carrier 120a and the second carrier 120b are removed after bonding the first substrate 110a to the second substrate 110b.

With reference to FIG. 1A and FIG. 1B, three grooves 111 are formed in the first substrate 110a, and three holes 112 are formed in the second substrate 110b, which are only exemplary descriptions of the embodiment. The number of grooves 111 and the number of holes 112 are not limited in the embodiment.

With reference to FIG. 1C and FIG. 1D, the groove 111 in the first substrate 110a is communicated with the hole 112 in the second substrate 110b by bonding. The diameter of the groove 111 is greater than that of the hole 112. It may be one groove 111 communicated with a respective one hole 112, or one groove 111 communicated with multiple holes 112 correspondingly.

Exemplarily, processes for forming the groove 111 and the hole 112 include, but are not limited to dry etching process, wet etching process, or any combination thereof.

With reference to FIG. 1D, a structure after removing the first carrier 120a and the second carrier 120b may be used as a packaging enclosure of a semiconductor chip, to package the semiconductor chip. In some embodiments, the semiconductor chip is fixed in the groove 111 of the first substrate 110a, a conductive plug is formed in the hole 112 of the second substrate 110b and coupled to the semiconductor chip, to guide electrical signals of the semiconductor chip out, for electrical signal interconnection with an external IC.

Continuing to refer to FIG. 1A, the first carrier 120a may not be etched during etching to form the groove 111. The first carrier 120a may protect a carrier carrying a wafer (such as an electrostatic chuck (ESC) or a vacuum sucker, or the like) of a dry etching machine, so that after the first substrate 110a is penetrated by a cavity, an etchant may be avoided from contacting the carrier through the cavity, reducing damage of the carrier.

During manufacturing of the packaging enclosure, when the first substrate 110a circulates between different devices, a vacuum adsorption device (such as a vacuum sucker) is required to transmit the first substrate 110a. During chemical mechanical grinding and wheel grinding processes, the vacuum adsorption device is also required to adsorb and fix the first substrate 110a. When there is no first carrier 120a, the vacuum adsorption device may be directly contacted with the first substrate 110a formed with groove 111, and the groove 111 may damage a vacuum environment between the first substrate 110a and the vacuum adsorption device, so that an adsorption action is unable to be performed, thus the first substrate 110a cannot be transmitted, and the first substrate 110a cannot be fixed for subsequent chemical mechanical grinding and wheel grinding processes, and even the first substrate 110a may be fragmented due to failure of adsorption, endangering the device.

It may be understood that mechanical strength of the first substrate 110a may decrease due to existence of multiple grooves 111, and direct adsorption or grasping of the first substrate 110a may increase a risk of fragmenting the first substrate 110a. Therefore, by bonding the first carrier 120a to the first substrate 110a, the first substrate 110a may be adsorbed or grasped by adsorbing or grasping the first carrier 120a, reducing the risk of fragmenting the first substrate 110a, and thus reducing damage of fragments to the device. The second carrier 120b has a function similar to that of the first carrier 120a, which will not be elaborated here.

With reference to FIG. 1C, during bonding the first substrate 110a to the second substrate 110b, the groove 111 and the hole 112 are required to be aligned, to ensure that the groove 111 is communicated with the hole 112. When there are increased number of grooves 111 and holes 112, alignment difficulty during bonding increases, resulting in a phenomenon that the groove 111 cannot be communicated with the hole 112, reducing a yield rate of manufacturing the packaging enclosure.

With reference to FIG. 1C and FIG. 1D, when the first carrier 120a and the second carrier 120b are removed by way of debonding to form the packaging enclosure 100, bonding of the first substrate 110a and the second substrate 110b may become invalid, resulting in separation of the first substrate 110a from the second substrate 110b. Furthermore, during usage of the semiconductor chip, the packaging enclosure 100 shown in FIG. 1D has a risk of debonding the first substrate 110a from the second substrate 110b at high temperature or under extrusion of an external force, which increases a risk of failure of the semiconductor chip.

Figure 2:
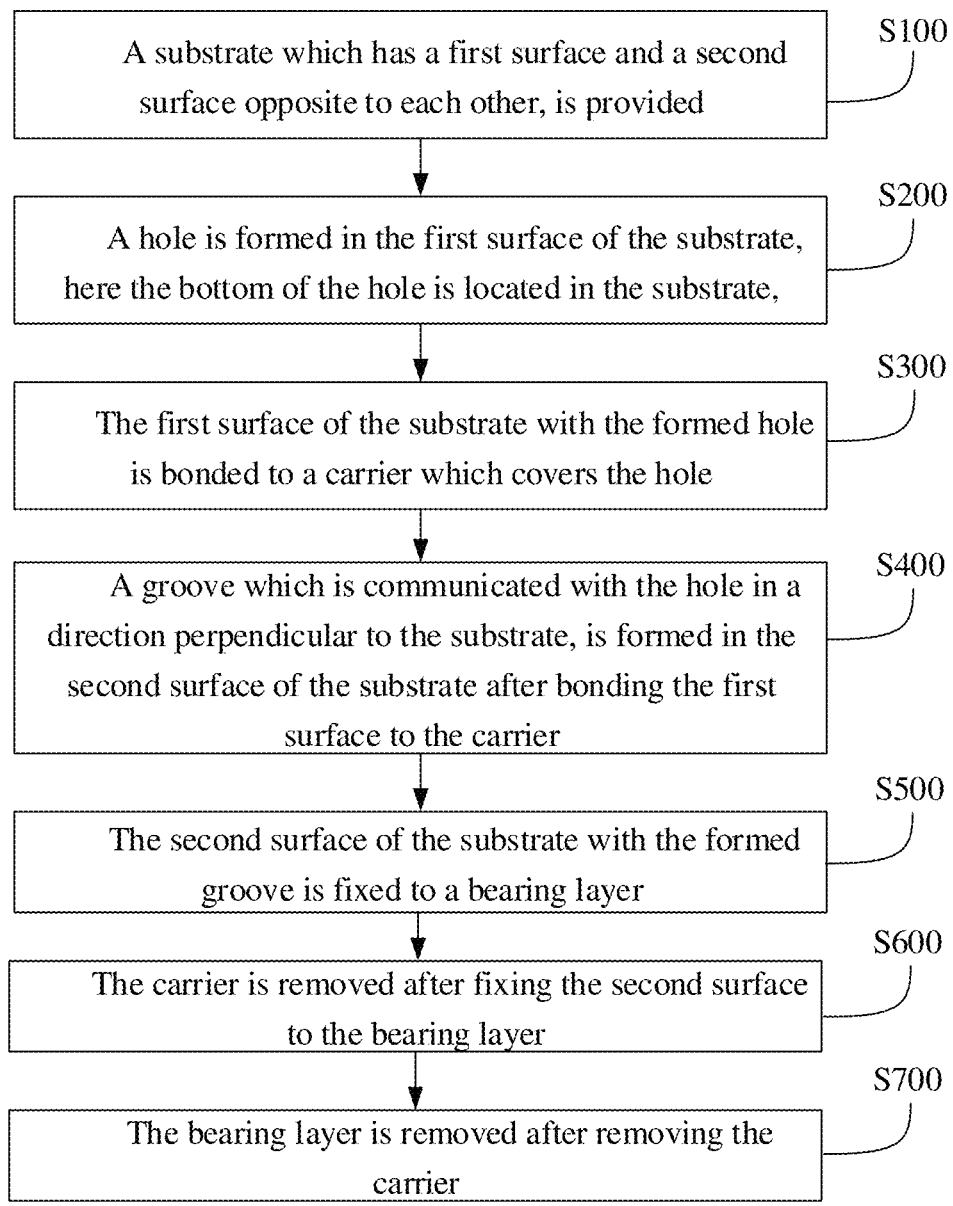
FIG. 2 shows a schematic flowchart of a method for manufacturing a packaging enclosure according to an embodiment of the disclosure.

FIG. 2 shows a schematic flowchart of a method for manufacturing a packaging enclosure according to an embodiment of the disclosure, and FIG. 3A to FIG. 3H show schematic views of a method for manufacturing a packaging enclosure according to an embodiment of the disclosure. With reference to FIG. 2 and FIG. 3A to FIG. 3H, the manufacturing method includes the following operations S100 to S700.

Figure 3A:
FIG. 3A shows a first schematic view of a method for manufacturing a packaging enclosure according to an embodiment of the disclosure.

In operation S100, with reference to FIG. 3A, a substrate 210 which has a first surface and a second surface opposite to each other, is provided.

Figure 3B:
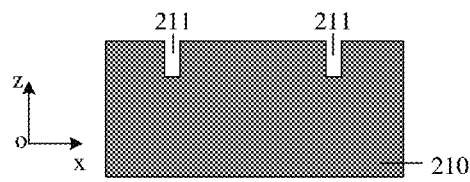
FIG. 3B shows a second schematic view of a method for manufacturing a packaging enclosure according to an embodiment of the disclosure.

In operation S200, with reference to FIG. 3B, a hole 211 of which the bottom is located in the substrate 210, is formed in the first surface of the substrate 210.

Figure 3C:
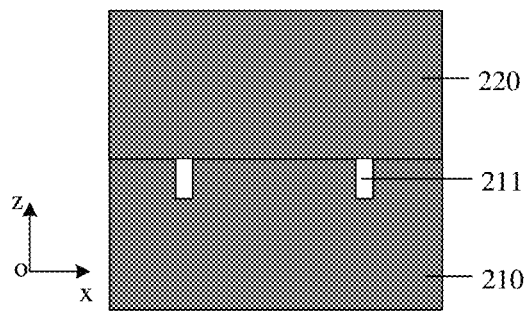
FIG. 3C shows a third schematic view of a method for manufacturing a packaging enclosure according to an embodiment of the disclosure.
Figure 3D:
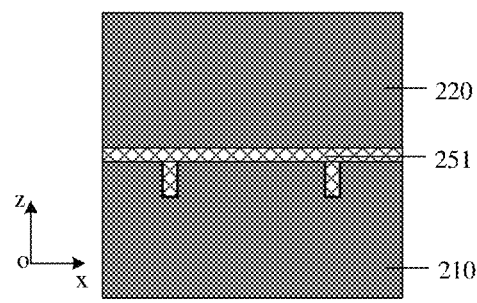
FIG. 3D shows a fourth schematic view of a method for manufacturing a packaging enclosure according to an embodiment of the disclosure.

In operation S300, with reference to FIG. 3C and FIG. 3D, the first surface of the substrate 210 with the formed hole 211 is bonded onto a carrier 220 which covers the hole 211.

Figure 3E:
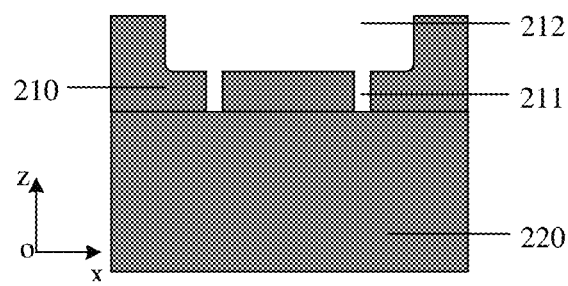
FIG. 3E shows a fifth schematic view of a method for manufacturing a packaging enclosure according to an embodiment of the disclosure.

In operation S400, with reference to FIG. 3E, a groove 212 which is communicated with the hole 211 in a direction perpendicular to the substrate 210, is formed in the second surface of the substrate 210 after bonding the first surface onto the carrier 220.

Figure 3F:
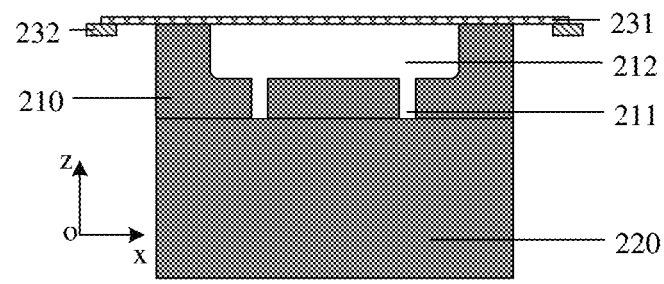
FIG. 3F shows a sixth schematic view of a method for manufacturing a packaging enclosure according to an embodiment of the disclosure.

In operation S500, with reference to FIG. 3F, the second surface of the substrate 210 with the formed groove 212 is fixed to a bearing layer 231.

Figure 3G:
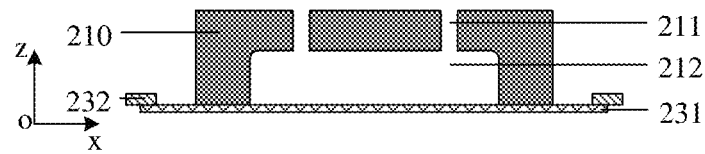
FIG. 3G shows a seventh schematic view of a method for manufacturing a packaging enclosure according to an embodiment of the disclosure.

In operation S600, with reference to FIG. 3G, the carrier 220 is removed after fixing the second surface to the bearing layer 231.

Figure 3H:
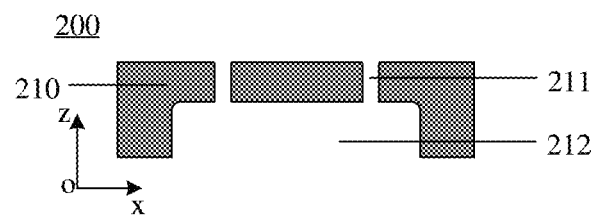
FIG. 3H shows an eighth schematic view of a method for manufacturing a packaging enclosure according to an embodiment of the disclosure.

In operation S700, with reference to FIG. 3H, the bearing layer 231 is removed after removing the carrier 220.

Exemplarily, a composition material of the substrate 210 may include simple substance semiconductor material (such as silicon and germanium), III-V group compound semiconductor material, II-VI group compound semiconductor material, organic semiconductor material, or other semiconductor materials known in the art. The composition material of the substrate 210 may further include silicon oxide material, aluminum oxide (sapphire) or ceramic material.

Exemplarily, in z direction perpendicular to the substrate 210, the first surface may be an upper surface of the substrate 210, and the second surface may be a lower surface of the substrate 210 opposite to the first surface, which will not be elaborated below.

Exemplarily, processes for forming the hole 211 and the groove 212 include, but are not limited to dry etching process, wet etching process, or any combination thereof.

Exemplarily, the carrier 220 may include a semiconductor wafer, and a composition material of the carrier 220 may be the same as or different from that of the substrate 210.

Specifically, with reference to FIG. 3B, when an etching process is performed on the first surface of the substrate 210 in the z direction to form the hole 211, the hole 211 only penetrates a part of thickness of the substrate 210, that is, depth of the hole 211 is less than thickness of the substrate 210, and the hole 211 is a blind hole located in the substrate 210.

With reference to FIG. 3C, a bonding process of bonding the first surface of the substrate 210 with the formed hole 211 onto the carrier 220 may include direct bonding or bonding through other bonding media.

In some embodiments, the direct bonding may include hot-pressing bonding. Specifically, at a high temperature, pressure is applied between bonding surfaces of the substrate 210 and the carrier 220 to make the molten bonding surfaces contacted, and then bonding may be completed after cooling. Composition materials of the substrate 210 and the carrier 220 are the same (for example, both the substrate 210 and the carrier 220 are of silicon materials, or both the substrate 210 and the carrier 220 are of metal materials), or composition materials of the substrate 210 and the carrier 220 are affine (for example, the substrate 210 is of silicon material, and the carrier 220 is of silicon oxide material), so that the direct bonding process may be applied.

In some embodiments, with reference to FIG. 3D, the substrate 210 is not directly contacted with the carrier 220 during bonding, and other bonding media are formed between the substrate 210 and the carrier 220 for bonding. For example, a bonding adhesive is coated on a surface of at least the substrate 210 or the carrier 220 to form a adhesion layer 251, and the substrate 210 and the carrier 220 are bonded together by the bonding adhesive. It may be understood that during bonding, the coated bonding adhesive is located on a surface of the substrate 210 facing toward the carrier 220; and/or, during bonding, the coated bonding adhesive is located on a surface of the carrier 220 facing toward the substrate 210. When the bonding adhesive is coated to form the adhesion layer 251, the hole 211 may be filled with the bonding adhesive, which may support the hole 211, reduce a probability of deformation of the hole 211 during bonding, and improve a yield rate of manufacturing the packaging enclosure.

It should be emphasized that with reference to FIG. 3C, the carrier 220 covers the first surface of the substrate 210 with the formed hole 211, and the carrier 220 completely covers an opening of the hole 211 to seal the opening of the hole 211, so as to facilitate formation of the groove 212 communicated with the hole 211 in the second surface of the substrate 210, reduce a probability of fragmenting the substrate 210 due to failure of vacuum adsorption, and improve a yield rate of manufacturing the packaging substrate.

With reference to FIG. 3C and FIG. 3D, after performing operation S300, the carrier 220 is located above the substrate 210 in the z direction. With reference to FIG. 3E, before performing operation S400, the carrier 220 and the substrate 210 which have been bonded are required to be flipped and inverted, so that the substrate 210 is located above the carrier 220. Therefore, the second surface of the substrate 210 may be exposed in an etchant to form the groove 212. When operation S400 is performed, an etching process may be performed to form the groove 212. The carrier 220 is contacted with a bearing platform of an etching device to avoid damage due to contacting between the first surface of the substrate 210 with the hole 211 and the bearing platform. Furthermore, the second surface of the substrate 210 is protected by the carrier 220, which will not be directly contacted with a transmission device during transmission of the substrate 210, reducing damage of the second surface of the substrate 210.

Continuing to refer to FIG. 3E, after the groove 212 is communicated with the hole 211, the etchant will reach a surface of the carrier 220 along the hole 211. Existence of the carrier 220 may reduce or even avoid damage of the bearing platform by the etchant.

Furthermore, after the groove 212 is communicated with the hole 211, the groove 212 and the hole 211 together form a penetration cavity penetrating the substrate 210 in the z direction. The carrier 220 may seal a side of the penetration cavity with the hole 211 (that is, the first surface of the substrate 210 with the formed hole 211). When the substrate 210 is subjected to a grasping action by vacuum adsorption, the penetration cavity will not damage vacuum adsorption. In this way, vacuum adsorption may be used for grasping, and a risk of fragments due to failure of grasping is reduced, thereby improving a yield rate of manufacturing the packaging enclosure. For example, when vacuum adsorption is performed on the substrate 210, a vacuum sucker may adsorb and grasp the carrier 220, and perform transmission or flipping action on the carrier 220 along with the substrate 210.

It should be emphasized that one groove 212 and one hole 211 shown in the embodiment are only examples, and more grooves 212 and more holes 211 may be formed.

Furthermore, one formed groove 212 may be communicated with at least one hole 211, and the number of communicated holes 211 is not specifically limited. It may be understood that in some embodiments, one formed groove 212 may be communicated with two holes 211, three holes 211 or more holes 211. The number of holes 211 communicated with the same groove 212 may be positively related to the number of conductive plugs required to be set according to chips embedded in the groove subsequently.

In some embodiments, with reference to FIG. 3E to FIG. 3H, one groove 212 may be communicated with at least two holes 211 in the z direction, to form a penetration cavity of sleeved holes.

In some embodiments, size of the groove 212 is greater than that of the hole 211 in a plane perpendicular to the z direction. Specifically, in some examples, with reference to FIG. 3E to FIG. 3H, in a projection plane perpendicular to the z direction, projection of the hole 211 falls within a range of projection of the groove 212. In some other examples, shape of each of the groove 212 and the hole 211 may include a cylinder, and diameter of the groove 212 is greater than that of the hole 211. In this way, when the groove 212 is formed, alignment difficulty between the groove 212 and the hole 211 may be reduced, occurrence of a phenomenon that the groove 212 cannot be communicated with the hole 211 is reduced, and a yield rate of manufacturing the packaging enclosure is improved.

In some embodiments, with reference to FIG. 3C to FIG. 3E, in the projection plane perpendicular to the z direction, a projection area of the carrier 220 is equal to or greater than that of the substrate 210. That is, the carrier 220 may completely cover the first surface of the substrate 210 with the formed hole 211 in the z direction. In this way, the carrier 220 may protect and seal the first surface of the substrate 210 with the formed hole 211 better, which is more conducive to vacuum adsorption of substrate 210 and improves a yield rate of manufacturing the packaging enclosure.

With reference to FIG. 3F, the second surface of the substrate 210 and the bearing layer 231 may be fixed by affixing, vacuum adsorption or electrostatic adsorption.

In some examples, the bearing layer 231 may include a film with viscosity, and another surface of the film may also be affixed to other devices. When operation S700 is performed, the film may be torn off the substrate 210 to form a packaging enclosure 200 as shown in FIG. 3H.

In some examples, the bearing layer 231 may further include a vacuum adsorption element or an electrostatic adsorption element. When operation S700 is performed, the bearing layer 231 may be desorbed from the substrate 210 to separate the bearing layer 231 from the substrate 210.

In the embodiment of the disclosure, the bearing layer 231 is intended to fix the substrate 210, which may reduce the number of required wafer bonding processes and reduce manufacturing cost. Furthermore, compared with fixed wafer bonding processes, the bearing layer 231 in the embodiment of the disclosure is easier to be removed. While the second surface of the substrate 210 with the formed groove 212 is protected, it is conducive to perform operation S700 and improve a yield rate of manufacturing the packaging enclosure.

With reference to FIG. 3F, after performing operation S500, the bearing layer 231 is located above the carrier 220. With reference to FIG. 3G, when operation S600 is performed, one surface of the bearing layer 231 may be fixed manually or by absorption using other devices, to flip the substrate 210 fixed on the other surface of the bearing layer, so that the carrier 220 is located above the bearing layer 231, which facilitates removing the carrier 220. A heat debonding method may be used to separate the carrier 220 from the substrate 210.

In some embodiments, after debonding the carrier 220 from the substrate 210, the carrier 220 may continue to be reused after cleaning and polishing.

In some embodiments, in FIG. 3H, the packaging enclosure 200 may be intended to package a semiconductor chip. Each of the groove 212 and the hole 211 has a small size, which may include a size of micron level or even nanometer level.

In some embodiments, the semiconductor chip is arranged in the groove 212 and fixed to the packaging enclosure 200, and the semiconductor chip is exposed from the hole 211. The semiconductor chip may include a photoelectric chip or a photosensitive device, and the hole 211 may be used as an optical path to transmit optical signals. In some other embodiments, a conductive plug may also be formed in the hole 112 and coupled to the semiconductor chip, to guide electrical signals of the semiconductor chip out, for electrical signal interconnection with an external IC.

In the embodiment of the disclosure, after forming a hole on the first surface of the substrate, the first surface of the substrate is bonded onto the carrier, and the carrier covers the hole. Since the carrier covers the hole, vacuum adsorption may be performed on the substrate through the carrier, facilitating formation of a groove communicated with the hole in the second surface of the substrate, reducing a probability of fragmenting the substrate due to failure of vacuum adsorption, and improving a yield rate of manufacturing the packaging substrate. Furthermore, after bonding the carrier to the first surface of the substrate with the formed hole, the carrier is contacted with a direct device during transmission of the substrate and manufacturing processes such as formation of the groove or the like, reducing damage of the first surface of the substrate.

In the embodiment of the disclosure, groove and hole communicated with each other (communicated in the direction perpendicular to the substrate) are manufactured on the substrate. Compared with a manufacturing method of forming grooves and holes on different substrates respectively, and then bonding two substrates together through a bonding process, the embodiment of the disclosure reduces the number of bonding the substrate, omits a process of aligning the groove with the hole during bonding, reduces a risk of fragment failure of the packaging enclosure due to debonding of the substrate during usage of the packaging enclosure, and improves a yield rate of the packaging enclosure.

In some embodiments, the method further includes the following operations before performing operation S200.

Figure 4A:
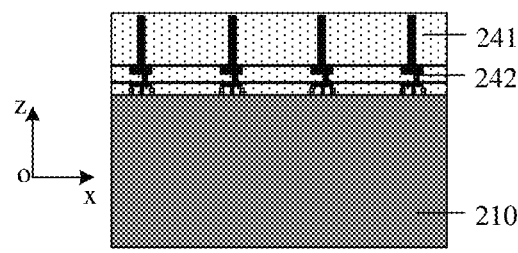
FIG. 4A shows a ninth schematic view of a method for manufacturing a packaging enclosure according to an embodiment of the disclosure.

With reference to FIG. 4A, a dielectric layer which covers the first surface 241 and is embedded with an electrical connection structure 242, is formed.

Figure 4B:
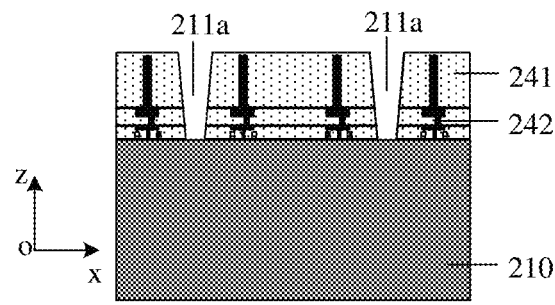
FIG. 4B shows a tenth schematic view of a method for manufacturing a packaging enclosure according to an embodiment of the disclosure.
Figure 4C:
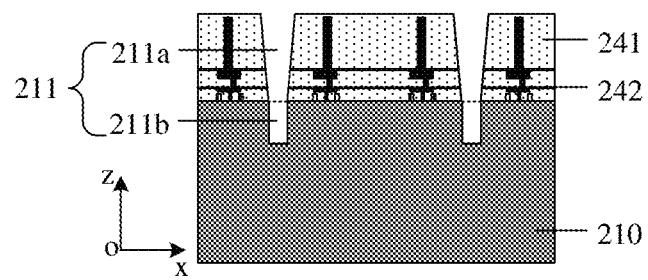
FIG. 4C shows an eleventh schematic view of a method for manufacturing a packaging enclosure according to an embodiment of the disclosure.

With reference to FIG. 4B and FIG. 4C, the hole 211 includes a first sub-hole 211a and a second sub-hole 211b communicated with each other, and the operation of forming the hole 211 in the first surface of the substrate 210 includes the following operations.

With reference to FIG. 4B, a first etching is performed on the dielectric layer 241 at a preset forming position of the hole 211, until the substrate 210 is exposed, to form the first sub-hole 211a.

With reference to FIG. 4C, a second etching is performed on the bottom of the first sub-hole 211a, to penetrate a part of thickness of the substrate 210, to form the second sub-hole 211b of which the bottom is located in the substrate 210.

It should be emphasized that a dotted line between the first sub-hole 211a and the second sub-hole 211b shown in FIG. 4C is only intended to distinguish areas of the first sub-hole 211a and the second sub-hole 211b in the embodiment more intuitively. The dotted line does not exist in an actual process of manufacturing the packaging enclosure.

Exemplarily, a composition material of the dielectric layer 241 includes, but is not limited to insulation material such as silicon oxide, silicon nitride, or silicon oxynitride, or the like.

Exemplarily, processes for forming the dielectric layer 241 may include any process known in the art, such as low-temperature chemical vapor deposition (CVD) process, low-pressure CVD process, rapid thermochemical vapor deposition (RTCVD) process, atomic layer deposition (ALD) process, or plasma-enhanced CVD process, or the like.

Exemplarily, the first etching and the second etching include, but are not limited to dry etching, wet etching, or any combination thereof.

Exemplarily, the electrical connection structure 242 includes, but is not limited to conductive pad, conductive wire, wiring layer, or any combination thereof. A composition material of the electrical connection structure 242 includes, but is not limited to copper, tungsten, aluminum, gold, titanium, or nickel, or the like. The number of electrical connection structures 242 are not limited in the disclosure, such as one or more conductive pads, one wiring layer or multiple stacked wiring layers.

With reference to FIG. 4A, the electrical connection structure 242 is formed in the dielectric layer 241, and the dielectric layer 241 surrounds the electrical connection structure 242, supports the electrical connection structure 242, and reduces damage of the electrical connection structure 242. Furthermore, electrical insulation may be formed between the electrical connection structures 242 to reduce a short-circuit phenomenon.

The electrical connection structure 242 has a small size, which may include a size of micron level or even nanometer level, and the electrical connection structure 242 may be intended to be coupled to the semiconductor chip or other semiconductor structures (or semiconductor devices).

In some embodiments, the electrical connection structure 242 may be used as a lead wire structure of the packaging enclosure, form a coupling with the semiconductor chip during packaging of the semiconductor chip, guide electrical signals of the semiconductor chip out, for electrical signal interconnection with an external IC. In some other embodiments, the electrical connection structure 242 may also be coupled to other electronic components to integrate more functions on the packaging enclosure.

In some embodiments, the substrate 210 in operation S100 may be a wafer, and the electrical connection structure 242 may be pre-formed on the wafer, and may include multiple pads, multiple conductive wires, or other conductive structures coupled mutually. It should be emphasized that the hole 211 will not penetrate and destroy these conductive structures when operation S200 is performed. For example, the hole 211 is formed in a slot between the conductive structures.

In some other embodiments, the substrate 210 may also be a wafer including a semiconductor structure (the semiconductor structure is not shown in figures of the embodiment), and the semiconductor structure may include a Complementary Metal Oxide Semiconductor (CMOS) circuit, a memory device, a photoelectric device, or a communication device, or the like. The electrical connection structure 242 is formed on the wafer and coupled to the semiconductor structure, which may integrate more functions on the manufactured packaging enclosure.

With reference to FIG. 4B and FIG. 4C, each of the dielectric layer 241 and the substrate 210 has a large thickness in the z direction, and it is difficult for a process of forming the hole 211 penetrating the dielectric layer 241 and a part of thickness of the substrate 210 by one etching, which is not conducive to maintaining a good overall appearance of the hole 211. In the embodiment of the disclosure, the hole 211 is formed by two etching, which may reduce difficulty of the etching process and is conducive to expanding windows of the etching process.

In some embodiments, the composition material of the dielectric layer 241 is different from that of the substrate 210. It is difficult to form holes in different materials by one etching, and it is difficult to control a good appearance of the hole 211.

For example, the dielectric layer 241 is of silicon oxide, and the substrate 210 is of silicon. In a process of performing the first etching, an etching rate of silicon oxide is greater than that of silicon, or silicon is not etched substantially in the first etching. In a process of performing the second etching, an etching rate of silicon is greater than that of silicon oxide, or silicon oxide is not etched substantially in the second etching.

In the embodiment of the disclosure, the first sub-hole 211*a* and the second sub-hole 211*b* are sequentially formed step-by-step by etching different material layers step-by-step, which is conducive to controlling appearances of the sub-holes, improving quality of the finished hole 211, improving a yield rate of manufacturing the packaging enclosure, and expanding windows of the etching process.

Figure 4D:
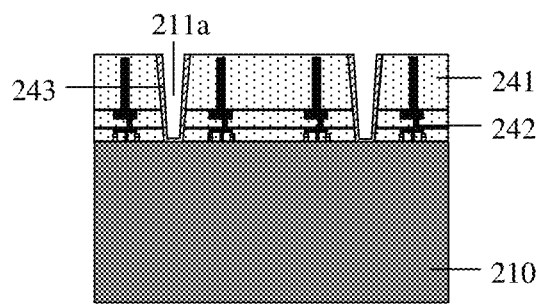
FIG. 4D shows a twelfth schematic view of a method for manufacturing a packaging enclosure according to an embodiment of the disclosure.

In some embodiments, with reference to FIG. 4D, the method further includes the following operations before forming the second sub-hole 211*b*.

A barrier layer 243 which covers an inner wall of the first sub-hole 211*a*, is formed.

The operation of performing the second etching includes the following operations.

The second etching is performed on the substrate 210 and the barrier layer 243 at the bottom of the first sub-hole 211*a*, to penetrate the part of thickness of the substrate 210 and the barrier layer 243 at the bottom of the first sub-hole 211*a*, to form the second sub-hole 211*b*.

Exemplarily, a composition material of the barrier layer 243 includes, but is not limited to silicon oxide, silicon nitride, silicon oxynitride, or aluminum oxide, or the like.

In the process of performing the second etching, an etching rate of the barrier layer 243 is less than that of the substrate 210, or the barrier layer 243 is not etched substantially in the second etching. The barrier layer 243 may reduce etching of a side wall of the first sub-hole 211*a* by the second etching, which is conducive to maintaining a good appearance of the first sub-hole 211*a*, improving quality of the finished hole 211, and improving a yield rate of manufacturing the packaging enclosure.

Figure 4E:
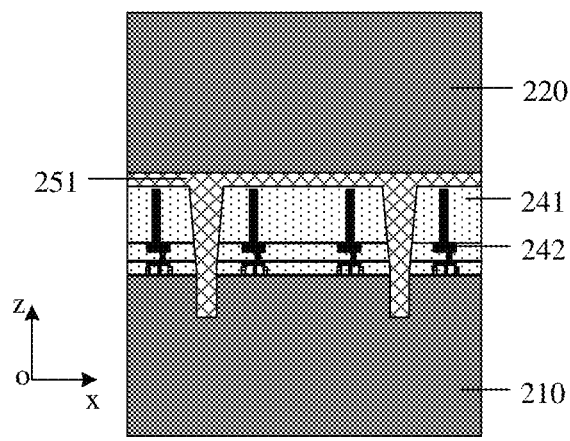
FIG. 4E shows a thirteenth schematic view of a method for manufacturing a packaging enclosure according to an embodiment of the disclosure.

In some embodiments, with reference to FIG. 4E, operation S300 includes the following operations.

An adhesion layer 251 is formed in a surface of at least the dielectric layer 241 or the carrier 220 after forming the hole 211, and the dielectric layer 241 is bonded onto the carrier 220 by the adhesion layer 251.

A composition material of the adhesion layer 251 includes, but is not limited to bonding adhesive, photosensitive adhesive (also called UV adhesive or ultraviolet curing adhesive), or resin with viscosity, or the like.

In the embodiment, the carrier 220 and the dielectric layer 241 on the substrate 210 are bonded by the adhesion layer 251. For example, a bonding adhesive is coated on a surface of at least the dielectric layer 241 or the carrier 220, and the substrate 210 and the carrier 220 are bonded by the bonding adhesive.

In some embodiments, the adhesion layer 251 may not fill the hole 211. For example, the bonding adhesive is coated on a surface of the carrier 220, and then the surface of the carrier 220 coated with the bonding adhesive is bonded to the surface of the substrate 210 formed with the dielectric layer 241, the bonding adhesive will not fill the hole 211.

In some other embodiments, when the adhesion layer 251 is formed, the adhesion layer 251 may fill the hole 211. For example, the bonding adhesive is coated on the surface of the dielectric layer 241 with the formed hole 211, and the bonding adhesive may fill the hole 211 simultaneously.

Compared with a process of hot-pressing bonding the dielectric layer 241 of the substrate 210 onto the carrier 220 directly, the adhesion layer 251 may implement bonding in a relatively low temperature environment, reduce damage of high temperature to the substrate 210, which is conducive to reducing manufacturing cost. Furthermore, in a process of performing operation S600, viscosity of the adhesion layer 251 may be reduced or lost by heating the adhesion layer 251, thereby separating the substrate 210 from the carrier 220, reducing damage of the substrate 210 when the carrier 220 is removed, reducing manufacturing difficulty, and improving a yield rate of manufacturing the packaging enclosure.

Figure 4F:
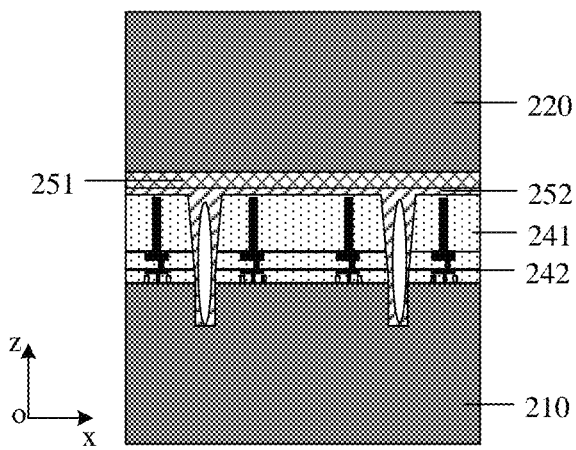
FIG. 4F shows a fourteenth schematic view of a method for manufacturing a packaging enclosure according to an embodiment of the disclosure.

In some embodiments, with reference to FIG. 4F, the method further includes the following operations before forming the adhesion layer 251.

A filler 252 which at least closes an opening of the hole 211, is formed in the hole 211.

A composition material of the filler 252 includes, but is not limited to bonding adhesive, photosensitive adhesive, bottom anti-reflective coating, silicon oxide, silicon nitride, oxynitride, or metal material, or the like.

Exemplarily, processes for forming the filler 252 may include any process known in the art, such as low-temperature CVD process, low-pressure CVD process, RTCVD process, ALD process, plasma-enhanced CVD process, or spin-coating process, or the like.

With reference to FIG. 4C, the number of holes 211 is not limited in the embodiment. It may be understood that the more the number of holes 211 formed in the first surface of the substrate 210, the less the remaining area of the first surface of the substrate 210, and the less the area of the first surface of the substrate 210 which may be bonded onto the carrier 220, reducing bonding strength. In the embodiment, the filler 252 is formed in the hole 211, may only close the opening of the hole 211, or may completely fill the hole 211. Or, the filler 252 closes the opening of the hole 211, and the filler 252 in the middle or bottom of the hole 211 may have a gap. The filler 252 closes the opening of the hole 211, which may increase area of the first surface of the substrate 210 bonded onto the carrier 220, improve the bonding strength, and also support and protect the hole 211 to reduce occurrence of deformation defects of the hole 211.

In some embodiments, a composition material of the filler 252 is the same as that of the adhesion layer 251.

Specifically, composition material of each of the filler 252 and the adhesion layer 251 may include bonding adhesive, photosensitive adhesive (also called UV adhesive or ultraviolet curing adhesive), or resin with viscosity, or the like. For example, after forming the hole 211, a bonding adhesive is coated on the first surface of the substrate 210 to fill the hole 211, and the bonding adhesive at least closes the opening of the hole 211. Then, the bonding adhesive is continued to be coated on the first surface of the substrate 210, to form the adhesion layer 251 covering the first surface of the substrate 210, and then the first surface of the substrate 210 is bonded onto the carrier 220. In this way, operations of depositing other materials to form the filler 252 may be reduced, and manufacturing cost may be reduced.

It may be understood that compared with coating the bonding adhesive only on the surface of at least the dielectric layer 241 or the carrier 220 to form the adhesion layer 251, the hole 211 is filled with the bonding adhesive in the embodiment, which may support the hole 211, reduce a probability of deformation of the hole 211 during bonding, and improve a yield rate of manufacturing the packaging enclosure.

In some embodiments, the hole 211 may be filled with metal to form the filler 252. Compared with other fillers 252, the metal filler 252 has higher mechanical strength, improves support of the hole 211, reduces a probability of deformation of the hole 211, and improves a yield rate of manufacturing the packaging enclosure. Furthermore, when the metal filler 252 is removed by performing wet etching and cleaning processes, the metal filler 252 reacts with an etchant to generate metal ions which are dissolved in the etchant, obtaining a better effect of removing the metal filler 252, reducing residue of the metal filler 252, and improving a yield rate.

Figure 4G:
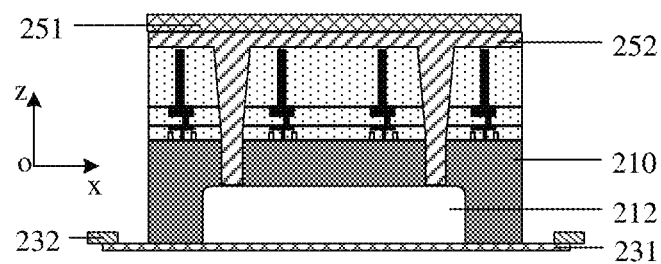
FIG. 4G shows a fifteenth schematic view of a method for manufacturing a packaging enclosure according to an embodiment of the disclosure.
Figure 4H:
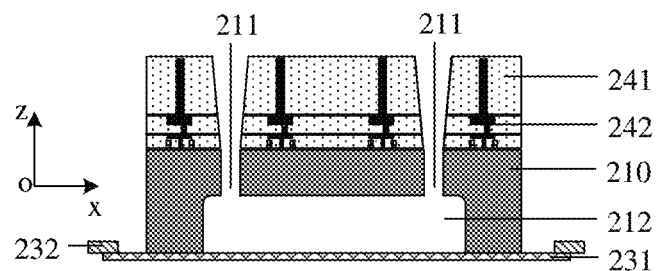
FIG. 4H shows a sixteenth schematic view of a method for manufacturing a packaging enclosure according to an embodiment of the disclosure.

In some embodiments, with reference to FIG. 4G and FIG. 4H, the method further includes the following operations after removing the carrier 220.

The adhesion layer 251 and the filler 252 in the hole 211 are removed.

Manners of removing the adhesion layer 251 and the filler 252 in the hole 211 include, but are not limited to dry etching, wet etching, cleaning, or any combination thereof.

In some embodiments, when at least the adhesion layer 251 or the filler 252 includes bonding adhesive and photosensitive adhesive, the adhesion layer 251 and the filler 252 in the hole 211 may be removed by wet etching and cleaning after heating or UV irradiation.

In some embodiments, with reference to FIG. 4G, operation S500 includes the following operations. The second surface of the substrate 210 with the formed groove 212 is affixed to the bearing layer 231, to fix the second surface to the bearing layer 231.

Figure 4I:
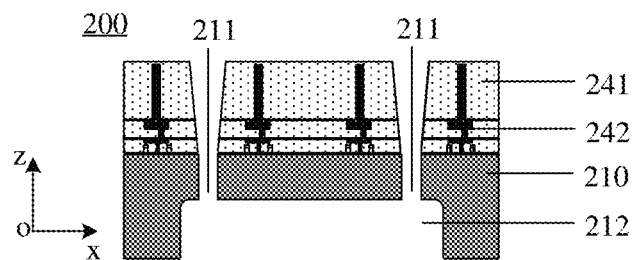
FIG. 4I shows a seventeenth schematic view of a method for manufacturing a packaging enclosure according to an embodiment of the disclosure.

With reference to FIG. 4H and FIG. 4I, operation S700 includes the following operations. The bearing layer 231 is removed after removing the adhesion layer 251 and the filler 252 in the hole 211.

The bearing layer 231 may be a bearing film or bearing plate with viscosity, and one surface of the bearing film or bearing plate is affixed to the second surface of the substrate 210 to fix the second surface, so as to implement flipping of the substrate 210. It may be understood that the bearing film or bearing plate may be provided with a membrane ring 232 through which the substrate 210 may be flipped and the bearing film or bearing plate may be removed.

Compared with fixing manners such as bonding, or welding, or the like, the fixing manner of affixing in the embodiment has a more simple process, reduces damage of the second surface of the substrate 210 with the formed groove 212, and improves a yield rate of the packaging enclosure.

In some embodiments, both surfaces of the bearing film or bearing plate have viscosity. One surface is affixed to the second surface of the substrate 210, and the other surface may be affixed to a process device.

In some embodiments, the method further includes the following operations before forming the groove 212.

The second surface of the substrate 210 is thinned, here thickness of the thinned substrate 210 is greater than depth of the hole 211.

Thinning processes include, but are not limited to dry etching, wet etching, chemical mechanical grinding, wheel grinding, or any combination thereof.

With reference to FIG. 3H and FIG. 4I, in the z direction, the substrate 210 of the packaging enclosure has a thickness included between 150 microns and 300 microns, so that the substrate 210 has a certain thickness to maintain good mechanical performance, while it does not make the substrate 210 too thick to reduce integrated density of IC.

When the substrate 210 has a thick thickness, for example, when the substrate 210 is a silicon wafer, the substrate 210 has a thickness of about 775 microns, and the substrate 210 is required to be thinned. In the embodiment, the second surface of the substrate 210 may be thinned before performing operation S400, so that the substrate 210 has a thickness included between 150 microns and 300 microns.

With reference to FIG. 3E, after thinning the second surface of the substrate 210, amount of etching to form the groove 212 may be reduced and etching difficulty may be reduced. It should be emphasized that after thinning the second surface of the substrate 210, the remaining second surface of the substrate 210 does not expose the hole 211.

Figure 5A:
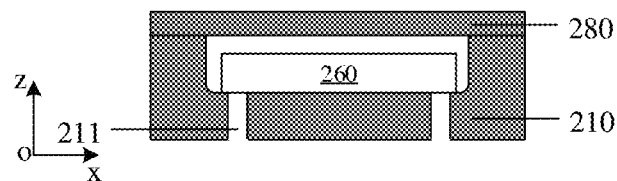
FIG. 5A shows a first schematic view of a method for manufacturing a packaging chip according to an embodiment of the disclosure.

FIG. 5A to FIG. 5D show schematic views of a method for manufacturing a packaging chip according to an embodiment of the disclosure. With reference to FIG. 5A, the method includes the following operations.

A packaging enclosure 200 is provided.

A semiconductor chip 260 is provided.

The semiconductor chip 260 is fixed to the packaging enclosure 200, so that the semiconductor chip 260 is arranged in the groove 212, here the hole 211 exposes at least a part of area of the semiconductor chip 260.

Exemplarily, the semiconductor chip 260 includes, but is not limited to digital circuit chip, analog circuit chip, Radio Frequency (RF)/microwave circuit chip, Microelectro Mechanical System (MEMS) chip, photonic chip, passive circuit chip, or the like.

Exemplarily, MEMS chip includes MEMS accelerometer, MEMS microphone, micromotor, micropump, microoscillator, MEMS pressure sensor, MEMS gyroscope, MEMS humidity sensor, and integrated products thereof.

The semiconductor chip 260 may be fixed in the groove 212 of the packaging enclosure 200, and fixing manners may include processes such as bonding, affixing, or welding, or the like.

MEMS chip may include a microcircuit and a micromachine, here the micromachine may include a kind of microelectronic device with a mechanical movable structure, may convert electrical signals into physical signals such as displacement, velocity, vibration, sound wave, or the like, and may also convert these physical signals into electrical signals. Therefore, when MEMS chip is packaged, it is required to minimize pressure applied by external pressure to MEMS chip, and provide a sealed movable space to the micromachine in MEMS chip.

With reference to FIG. 5A, the semiconductor chip 260 is packaged with the packaging enclosure 200 as shown in FIG. 3H. The semiconductor chip 260 is fixed in the groove 212, and thickness of the semiconductor chip 260 may be less than depth of the groove 212. After fixing the semiconductor chip 260 to the packaging enclosure 200, a packaging cover plate 280 may also be fixed to the packaging enclosure 200.

The groove 212 in the embodiment may provide a closed cavity to the semiconductor chip 260 after completing packaging, and may provide a movable space to movable parts of MEMS chip. It may be understood that for other semiconductor chips 260 without movable space, after fixing the semiconductor chip 260 to the packaging substrate 210, the groove 212 may be filled with an insulation material to form an insulation layer covering the semiconductor chip 260.

In some embodiments, continuing to refer to FIG. 5A, the semiconductor chip 260 may include a photoelectric chip or a photosensitive device. The hole 211 may be used as an optical path to transmit optical signals, so that the semiconductor chip may be interconnected with optical signals. In some other embodiments, the hole 211 may include multiple slot structures extending perpendicular to an xoz plane. Multiple holes 211 may divide the first surface of the substrate 210 into multiple gratings. The hole 211 may also debug optical signals through transmission light diffraction or reflection light diffraction while transmitting the optical signals, to meet requirements of different semiconductor chips 260 for different intensities and different modes of optical signals.

Figure 5B:
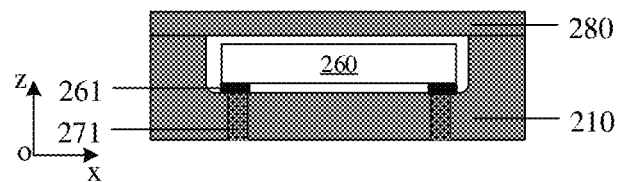
FIG. 5B shows a second schematic view of a method for manufacturing a packaging chip according to an embodiment of the disclosure.
Figure 5C:
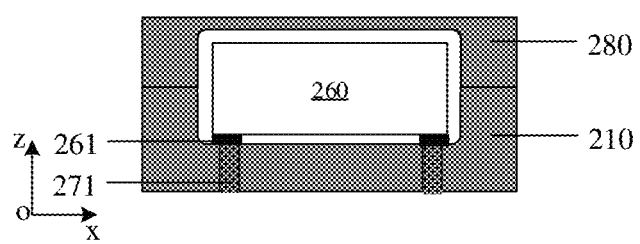
FIG. 5C shows a third schematic view of a method for manufacturing a packaging chip according to an embodiment of the disclosure.
Figure 5D:
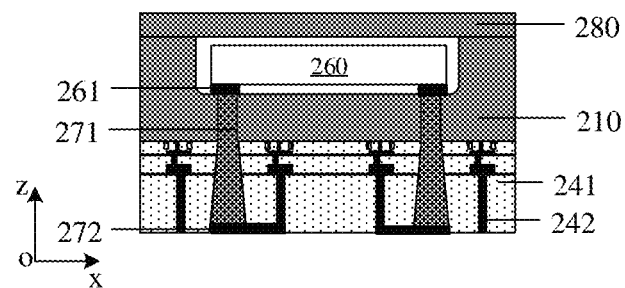
FIG. 5D shows a fourth schematic view of a method for manufacturing a packaging chip according to an embodiment of the disclosure.

In some embodiments, with reference to FIG. 5B to FIG. 5D, a surface of the semiconductor chip 260 is provided with a pad 261 which is exposed from the hole 211, and the method further includes the following operations.

The hole 211 is filled with a conductive material, to form a conductive plug 271 coupled to the pad 261.

Exemplarily, processes for forming the conductive plug 271 and the pad 261 include, but are not limited to physical deposition, chemical deposition, or electroplating, or the like. Composition materials of the conductive plug 271 and the pad 261 include, but are not limited to copper, tungsten, aluminum, gold, titanium, or nickel, or other conductive materials. The conductive plug 271 is coupled to the pad 261 to guide electrical signals of the semiconductor chip 260 out, for electrical signal interconnection with an external IC.

In some embodiments, with reference to FIG. 5C, when the semiconductor chip 260 has a large height, the packaging cover plate 280 with a recess may be used to form a cavity.

In some embodiments, with reference to FIG. 5D, the semiconductor chip 260 is packaged with the packaging enclosure 200 as shown in FIG. 4I. The conductive plug 271 may be coupled to the electrical connection structure 242 through the conductive structure 272, and the electrical connection structure 242 guides electrical signals of the semiconductor chip 260 out, for electrical signal interconnection with an external IC. The conductive structure 272 includes a cylindrical or strip shaped contacting plug.

Each of the groove 212, the hole 211, the pad 261, the conductive plug 271, the electrical connection structure 242 and the conductive structure 272 in the embodiment of the disclosure may include a size of micron level or even nanometer level, to meet packaging of high-integration semiconductor chips, thereby improving integration of an external IC.

The packaging enclosure of the embodiment may provide a cavity to the semiconductor chip when the semiconductor chip is packaged, While supporting and protecting the semiconductor chip, it may also provide a movable space to the semiconductor chip with movable parts (such as MEMS chip), and may also provide interconnection of optical or electrical signals to different semiconductor chips, which is conducive to packaging various semiconductor chips and maintaining good functions of the semiconductor chips.

In the embodiment of the disclosure, after forming a hole on the first surface of the substrate, the first surface of the substrate is bonded onto the carrier, and the carrier covers the hole. Since the carrier covers the hole, vacuum adsorption may be performed on the substrate through the carrier, facilitating formation of a groove communicated with the hole in the second surface of the substrate, reducing a probability of fragmenting the substrate due to failure of vacuum adsorption, and improving a yield rate of manufacturing the packaging substrate. Furthermore, after bonding the carrier to the first surface of the substrate with the formed hole, the carrier is contacted with a direct device during transmission of the substrate and manufacturing processes such as formation of the groove or the like, reducing damage of the first surface of the substrate.

The foregoing are only specific embodiments of the disclosure, however, the scope of protection of the disclosure is not limited thereto. Variation or substitution which may be readily conceived by those skilled in the art within the technical scope disclosed in the disclosure should fall within the scope of protection of the disclosure. Therefore, the scope of protection of the disclosure should conform to the scope of protection of the claims.

What is claimed is:

1. A method for manufacturing a packaging enclosure, comprising:
   providing a substrate which has a first surface and a second surface opposite to each other;
   forming a hole in the first surface of the substrate, bottom of the hole being located in the substrate;
   bonding the first surface of the substrate with the formed hole onto a carrier which covers the hole;
   forming, a groove, in the second surface of the substrate after bonding the first surface onto the carrier, the groove being communicated with the hole in a direction perpendicular to the substrate;
   fixing the second surface of the substrate with the formed groove to a bearing layer;
   removing the carrier after fixing the second surface to the bearing layer; and
   removing the bearing layer after removing the carrier.

2. The method of claim 1, further comprising:
   before forming the hole, forming a dielectric layer which covers the first surface and in which an electrical connection structure is embedded,
   wherein the hole comprises a first sub-hole and a second sub-hole communicated with each other, and forming the hole in the first surface of the substrate comprises:
   performing a first etching on the dielectric layer at a preset forming position of the hole, until the substrate is exposed, to form the first sub-hole; and
   performing a second etching on bottom of the first sub-hole, to penetrate a part of thickness of the substrate, to form the second sub-hole of which bottom is located in the substrate.

3. The method of claim 2, further comprising:
   before forming the second sub-hole, forming a barrier layer which covers an inner wall of the first sub-hole,
   wherein performing the second etching comprises:
   performing the second etching on the substrate and the barrier layer at the bottom of the first sub-hole, to penetrate the part of thickness of the substrate and the barrier layer at the bottom of the first sub-hole, to form the second sub-hole.

4. The method of claim 2, wherein bonding the first surface of the substrate with the formed hole onto the carrier comprises:
   forming an adhesion layer in a surface of at least the dielectric layer or the carrier after forming the hole, and bonding the dielectric layer onto the carrier by the adhesion layer.

5. The method of claim 4, further comprising:
   before forming the adhesion layer, forming a filler in the hole, the filler at least closing an opening of the hole.

6. The method of claim 5, wherein a composition material of the filler is the same as that of the adhesion layer.

7. The method of claim 5, further comprising:
   after removing the carrier, removing the adhesion layer and the filler in the hole.

8. The method of claim 7, wherein fixing the second surface of the substrate with the formed groove to the bearing layer comprises: affixing the second surface of the substrate with the formed groove to the bearing layer, to fix the second surface to the bearing layer,
   removing the bearing layer after removing the carrier comprises: removing the bearing layer after removing the adhesion layer and the filler in the hole.

9. The method of claim 1, further comprising:
   before forming the groove, thinning the second surface of the substrate, wherein thickness of the thinned substrate is greater than depth of the hole.

10. A method for manufacturing a packaging chip, comprising:
    providing the packaging enclosure manufactured by the method of claim 1;
    providing a semiconductor chip; and
    fixing the semiconductor chip to the packaging enclosure, the semiconductor chip being arranged in the groove, wherein the hole exposes at least a part of area of the semiconductor chip.

11. The method of claim 10, wherein a surface of the semiconductor chip is provided with a pad which is exposed from the hole, and the method further comprises:
    filling the hole with a conductive material, to form a conductive plug coupled to the pad.

12. A packaging chip comprising:
    a packaging enclosure manufactured by the method of claim 1;
    a semiconductor chip which is fixed to the packaging enclosure, the semiconductor chip being arranged in the groove, wherein the hole exposes at least a part of area of the semiconductor chip.

13. The packaging chip of claim 12, wherein a surface of the semiconductor chip is provided with a pad which is exposed from the hole, and a conductive plug coupled to the pad is formed by filling the hole with a conductive material.

* * * * *